(12) United States Patent
van Kouwen et al.

(10) Patent No.: US 9,941,094 B1
(45) Date of Patent: Apr. 10, 2018

(54) INNOVATIVE SOURCE ASSEMBLY FOR ION BEAM PRODUCTION

(71) Applicant: FEI Company, Hillsboro, OR (US)

(72) Inventors: Leon van Kouwen, Rotterdam (NL); Gerard Nicolaas Anne van Veen, Waarle (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/422,454

(22) Filed: Feb. 1, 2017

(51) Int. Cl.
*H01J 37/08* (2006.01)
*H01J 37/147* (2006.01)
*H01J 37/26* (2006.01)

(52) U.S. Cl.
CPC ............ *H01J 37/08* (2013.01); *H01J 37/147* (2013.01); *H01J 37/261* (2013.01)

(58) Field of Classification Search
CPC ......... H01J 37/08; H01J 37/147; H01J 37/261
See application file for complete search history.

(56) References Cited

U.S. PATENT DOCUMENTS

| | | | |
|---|---|---|---|
| 3,434,894 A | 3/1969 | Gale | |
| 4,430,570 A | 2/1984 | Takigawa et al. | |
| 4,438,371 A | 3/1984 | Hosoki et al. | |
| 4,500,787 A | 2/1985 | Poole et al. | |

(Continued)

FOREIGN PATENT DOCUMENTS

| | | |
|---|---|---|
| CN | 1477984 A | 2/2004 |
| CN | 101026080 A | 8/2007 |

(Continued)

OTHER PUBLICATIONS

"Electron Microscope", Wikipedia, Retrieved from the Internet Oct. 15, 2015, http://en.wikipedia.org/wiki/Electron_microscope 11 pages.

(Continued)

*Primary Examiner* — Jason McCormack
*Assistant Examiner* — Sean Luck
(74) *Attorney, Agent, or Firm* — Scheinberg & Associates, P.C.; Michael O. Scheinberg

(57) ABSTRACT

A source assembly for producing an ion beam and comprising a collision ionization ion source having:
  A pair of stacked plates, sandwiched about an intervening gap;
  An ionization space between said plates, connected to a gas supply duct;
  An input zone, provided in a first of said plates, to admit an input beam of charged particles to said ionization space;
  An output aperture, located opposite said input zone and provided in the second of said plates, to allow emission of a flux of ions produced in said ionization space by said input beam,
which source assembly comprises:
  A carrier provided with a plurality of different collision ionization ion sources that mutually differ in respect of a gap height d between said plates;
  A selecting device, which allows a given one of said ion sources to be individually selected for production of said ion beam.
The various sources in said plurality preferably have a scattering quotient $Q_S = d/l_i$ with a value in a range 1-500, preferably in a range 1-200, where $l_i$ is an ionic mean free path length in said ionization space.

18 Claims, 3 Drawing Sheets

(56) References Cited

U.S. PATENT DOCUMENTS

Figure 1A:
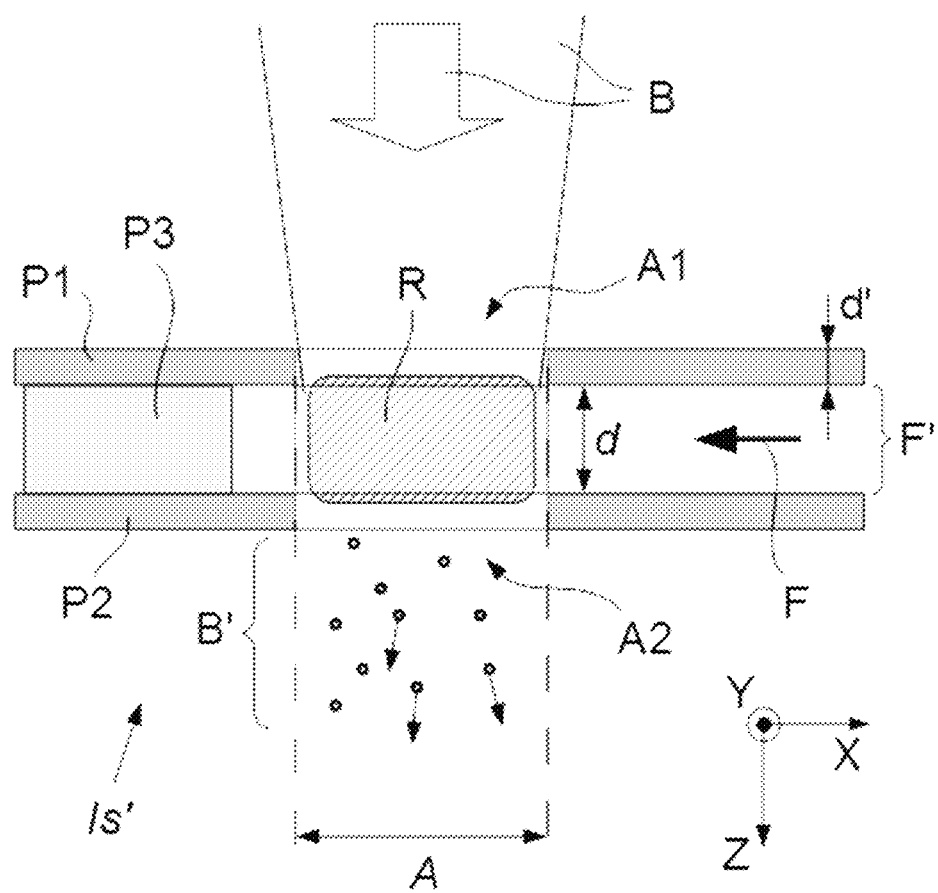

| | | | |
|---|---|---|---|
| 4,503,329 | A | 3/1985 | Yamaguchi et al. |
| 4,663,559 | A | 5/1987 | Christensen |
| 4,670,685 | A | 6/1987 | Clark et al. |
| 4,933,551 | A | 6/1990 | Bernius et al. |
| 4,954,711 | A | 9/1990 | Fink et al. |
| 5,041,732 | A | 8/1991 | Saito et al. |
| 5,083,061 | A | 1/1992 | Koshiishi et al. |
| 5,300,785 | A | 4/1994 | Aitken |
| 5,583,344 | A | 12/1996 | Mizumura et al. |
| 5,587,586 | A | 12/1996 | Kruit |
| 6,040,973 | A | 3/2000 | Okamoto et al. |
| 6,218,672 | B1 | 4/2001 | Alig |
| 6,545,269 | B1 | 4/2003 | Pierrejean et al. |
| 6,693,282 | B1 | 2/2004 | Tiemeijer |
| 7,002,160 | B1 | 2/2006 | Glass et al. |
| 7,067,821 | B2 | 6/2006 | Barnard et al. |
| 7,241,361 | B2 | 7/2007 | Keller et al. |
| 7,304,299 | B2 | 12/2007 | Perkins |
| 7,442,942 | B2 | 10/2008 | Takahashi et al. |
| 7,609,003 | B2 | 10/2009 | Horsky et al. |
| 7,772,564 | B2 | 8/2010 | Kruit et al. |
| 7,968,855 | B2 | 6/2011 | Frosien |
| 8,076,650 | B2 | 12/2011 | Smith et al. |
| 8,168,957 | B2 | 5/2012 | Keller et al. |
| 8,253,118 | B2 | 8/2012 | Zhang et al. |
| 8,405,054 | B2 | 3/2013 | Smith et al. |
| 8,445,870 | B2 | 5/2013 | Zhang et al. |
| 8,455,822 | B2 | 6/2013 | Rue |
| 9,224,569 | B2 | 12/2015 | Schwind et al. |
| 2003/0057378 | A1 | 3/2003 | Pierrejean et al. |
| 2006/0011834 | A1 | 1/2006 | Nishimura et al. |
| 2006/0097645 | A1 | 5/2006 | Horsky |
| 2007/0114438 | A1* | 5/2007 | Holle ............... H01J 49/10 250/423 R |
| 2007/0138403 | A1 | 6/2007 | Cubric et al. |
| 2007/0262263 | A1 | 11/2007 | Kruit et al. |
| 2008/0142702 | A1 | 6/2008 | Frosien et al. |
| 2009/0229969 | A1* | 9/2009 | Hoffman ............... C23C 14/35 204/192.12 |
| 2009/0309018 | A1 | 12/2009 | Smith et al. |
| 2010/0108902 | A1 | 5/2010 | Frosien et al. |
| 2011/0272593 | A1 | 11/2011 | Graf et al. |
| 2012/0056088 | A1 | 3/2012 | Rue |
| 2012/0168638 | A1 | 7/2012 | Parker |
| 2012/0217152 | A1 | 8/2012 | Miller |
| 2012/0280136 | A1 | 11/2012 | Zhang et al. |
| 2012/0319000 | A1 | 12/2012 | Keller et al. |
| 2013/0015765 | A1 | 1/2013 | Graupera et al. |
| 2013/0112890 | A1 | 5/2013 | Parker et al. |
| 2013/0134307 | A1 | 5/2013 | Routh |
| 2013/0140450 | A1 | 6/2013 | Graupera et al. |
| 2013/0221232 | A1* | 8/2013 | Makarov ............... H01J 27/205 250/396 R |
| 2013/0248490 | A1 | 9/2013 | Rasmussen et al. |
| 2014/0001372 | A1* | 1/2014 | Schwind ............... H01J 27/205 250/396 R |
| 2016/0005594 | A1* | 1/2016 | Omstead ........... C23C 16/45536 438/778 |

FOREIGN PATENT DOCUMENTS

| | | |
|---|---|---|
| CN | 101384747 B | 11/2013 |
| EP | 0056899 A1 | 8/1982 |
| EP | 2088613 A1 | 8/2009 |
| JP | 60257048 | 12/1985 |
| JP | 61193348 | 8/1986 |
| JP | 02054851 | 2/1990 |
| JP | 03276546 | 6/1991 |
| JP | H03276546 | 12/1991 |

OTHER PUBLICATIONS

"Focused Ion Beam", Wikipedia, Retrieved from the Internet Jul. 11, 2016, https://en.wikipedia.org/wiki/Focused_ion_beam, 7 pages.

"Nanolithography", Wikipedia, Retrieved from the Internet Apr. 3, 2017, https://en.wikipedia.org/wiki/Nanolithography, 4pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

Jun, David Sangbom, "Development of the Nano-Aperture Ion Source (NAIS)," ISBN 978-94-6186-384-3, 2014, 151 pages:repository.tudelft.nl/islandora/object/uuid;23a0ceae-2662-4f6a-9082421d1a872a39/?collection=research.

Varentsov, D. et al. "First biological images with high-energy proton microscopy", Physica Medica (2013), pp. 208-213, vol. 29.

* cited by examiner

INNOVATIVE SOURCE ASSEMBLY FOR ION BEAM PRODUCTION

The invention relates to a source assembly for producing an ion beam and comprising a collision ionization ion source having:
- A pair of stacked plates, sandwiched about an intervening gap;
- An ionization space between said plates, connected to a gas supply duct;
- An input zone, provided in a first of said plates, to admit an input beam of charged particles to said ionization space;
- An output aperture, located opposite said input zone and provided in the second of said plates, to allow emission of a flux of ions produced in said ionization space by said input beam The invention also relates to a method of using such an ion source assembly.

The invention further relates to an ion focusing apparatus comprising:
- A source assembly as specified above, for producing an ion beam;
- A specimen holder, for holding a specimen in an irradiation position;
- An optical column, for directing said beam so as to irradiate said specimen.

Examples of such an ion focusing apparatus include a charged-particle microscope or charged-particle lithography imager, for instance.

The invention additionally relates to a collision ionization ion source suitable for use in such an ion source assembly/ion focusing apparatus.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
en.wikipedia.org/wiki/Electron_microscope
en.wikipedia.org/wiki/Scanning_electron_microscope
en.wikipedia.org/wiki/Transmission_electron_microscopy
en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
en.wikipedia.org/wiki/Focused_ion_beam
en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).
www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
- A particle source, such as a Schottky electron source or ion source.
- An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) can be used to (concurrently) modify (machine/process) and/or image the specimen, whereby the specimen holder can be positioned in multiple degrees of freedom so as to suitably "present" a surface of the specimen to the employed electron/ion beams. In the case of a transmission-type microscope (such as a (S)TEM, for example), a CPM will specifically comprise:

An imaging system (imaging particle-optical column), which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In a lithography imager (e.g. wafer stepper/wafer scanner), an actinic beam of radiation is used to pattern an energy-sensitive later of material (photoresist) that has been provided (e.g. spin-coated) on a surface of a substrate (e.g. semiconductor wafer). Traditionally, the actinic beam has comprised a broad beam of photons (e.g. from a mercury lamp or laser), which pass through a mask/reticle and impart its pattern onto the photosensitive later. However, other types of lithography imager make use of charged particles, such as so-called "direct write" electron beam tools, which trace one or more electron beams over the photosensitive layer according to the desired pattern. Still other lithography imager concepts make use of ion beams. Analogous to the discussion above for a CPM, a lithography imager will also generically comprise a radiation source, illuminator and specimen holder, and will additionally comprise an imaging system in the case of mask-based lithography; moreover, it will generally comprise one or more detectors—though these will typically be used for purposes such as dose/uniformity calibration, positioning (overlay/alignment) verification, etc. Some general information on lithography can be found in the following link:
en.wikipedia.org/wiki/Nanolithography In what follows, the invention may—by way of example—sometimes be set forth in the specific context of charged particle microscopy; however, such simplification is intended solely for clarity/illustrative purposes, and should not be interpreted as limiting.

As regards ion sources, the skilled artisan can choose from various possibilities, including Liquid Metal Ion Sources (LMIS), plasma sources, photoionization sources, etc. Of specific interest in the context of the present invention is the collision ionization ion source (e.g. electron impact ionization source), in which an input beam of charged particles (such as electrons) is used to ionize molecules/atoms of gas in an ionization space. To this end, the gas is introduced into a narrow gap between two oppositely-located retaining plates (sheets, membranes), one of which contains an input zone (such as an aperture, or (locally thinned) lamina/film) to admit said input beam and the other of which contains an oppositely located output aperture to allow emission of a flux of ions produced in said ionization region by interaction of the input beam with the gas. Because at least a portion of the gas in question is converted to said ion flux and/or will leak from said output aperture (and input aperture, if the input zone is configured as such), there needs to be a replenishing supply of gas to said ionization space, in order to realize satisfactory continuous operation of the source. In order to achieve a relatively high source brightness, the ionization region is preferably very small, so as to ensure a relatively high density of input charged particles therein; as a consequence, the whole device tends to be very small, with typical input zone/output aperture diameters of the order of a few microns or a few hundred nanometers, for example. For this reason, such sources can also be alluded to as Nano-Aperture Ionization Sources (NAIS), and they are typically manufactured as integrated devices using MEMS technology (MEMS=Micro Electro Mechanical Systems). For more information on NAIS devices, see, for example:

U.S. Pat. No. 7,772,564, assigned to the assignee of the present invention;

The doctoral thesis "Development of the Nano-Aperture Ion Source (NAIS)" by David Sangbom Jun, Delft University of Technology (in conjunction with the assignee of the present invention), ISBN 978-94-6186-384-3 (2014): repository.tudelft.nl/islandora/object/uuid:23a0ceae-2662-4f6a-9082-f21d1a872a39/?collection=research, both of which documents are incorporated herein by reference.

NAIS devices are advantageous in that they can be relatively easily used to generate a variety of different ion species—simply by changing the gas administered to the ionization region. Moreover, because they are small and relatively cheap, and can be manufactured en masse using MEMS fabrication techniques, they can be easily and cheaply switched out/replaced when they reach end-of-lifetime. However, although they have a relatively straight-forward structure, in practice it has proven exceptionally difficult to optimize performance of NAIS sources.

It is an object of the invention to address this issue. More specifically, it is an object of the invention to provide an improved ion beam source assembly that employs collision ionization ion beam generation and in which ion beam properties can be more successfully tuned to the requirements of a given application.

These and other objects are achieved in an ion beam source assembly as set forth in the opening paragraph above, characterized in that the source assembly comprises:

A carrier provided with a plurality of different collision ionization ion sources that mutually differ in respect of a gap height d between said plates;

A selecting device, which allows a given one of said ion sources to be individually selected for production of said ion beam.

During extensive experimentation and analysis leading to the invention, the inventors investigated why prior-art NAIS devices tended to be unpredictable/inconsistent as regards important parameters such as beam brightness, emission current, beam energy spread, beam opening angle and virtual source size. Ideally, a NAIS source would behave somewhat like a light bulb connected to a dimmer switch: just as the bulb glows predictably brighter when it receives more current from the dimmer, an ideal NAIS should increase ion output in a predictable manner when its gas supply is increased. In reality, such predictable behavior is not observed, and the performance of the NAIS turns out to demonstrate a complicated dependence on a variety of factors. One such factor—the flow conductance of the gas supply duct in the NAIS—received particular attention in co-pending patent application U.S. Ser. No. 15/405,139 (filed 12 Jan. 2017; incorporated herein by reference). However, the current inventors surmised that other factors were also playing a significant role—though it took significant research effort before such factors could be properly understood. Eventually, the inventors realized that, in addition to fluidic behavior of gas in the supply duct, the fluidic behavior of ions in the ionization space was of key importance. More specifically, the ratio of the (defined) height (d) of the ionization space (i.e. the gap height between the NAIS plates at the ionization space) to the ionic mean free path length ($l_i$) turned out to be of critical significance. The inventors dubbed this ratio the "ionic scattering quotient" $Q_S=d/l_i$, because it is indicative of how many scattering events a typical ion will undergo in the ionization space before escaping from the output aperture. As a rule of thumb, the inventors discovered that (relatively low) sub-unity values of $Q_S$ (e.g. $Q_S$=0.2) were generally undesirable, because they allowed insufficient generation of ions to occur in the ionization space, leading (for example) to a relatively low ion current in the emitted ion beam; in contrast, values of $Q_S$ (substantially) greater than unity (e.g. $Q_S$=10) resulted in significant ion scattering, with a tendency toward enlarged energy spread and greater virtual source size as a result. As a consequence of these insights, the inventors realized that, when one adjusts the gap height d of a NAIS design—in order to achieve a higher ion beam current, for example—one should concurrently ensure that the value of $Q_S$ (which is directly influenced by d) remains within an acceptable range. It is this—previously unrecognized—concurrency that explains the unpredictable outcome of prior-art NAIS design efforts. At the same time, it is this concurrency that led the inventors to realize that a single NAIS could not, in practice, be satisfactorily operated in disparate "regimes"—such as "high current" and "high monochromaticity". This latter insight led to a source design incorporating a variety of different NAIS sources—designed to operate in (different parts of) different regimes—in conjunction with a selecting device that allows a given NAIS—best suited to a given application—to be selected at will.

For the purpose of giving some non-limiting guidance, the inventors have found that, for many applications, a value of $Q_S$ in the range 5-15 gives very satisfactory all-round results. If one wants to specifically achieve a relatively large beam current, then choice of a larger $Q_S$ value becomes appropriate, e.g. in a range 25-75. For very large beam currents, $Q_S$ values of 100 and above become relevant.

The ionization region in a CIIS typically has a relatively low ionization yield, i.e. for each ion therein there will be a much greater number of neutral gas particles present. The ionic mean free path length t can accordingly be regarded as expressing the average distance that such an ion can travel before undergoing a collision with a neutral particle. The inventors have found that, for a neutral particle density n in the ionization space and an electric field E between the retaining plates of the CIIS, $l_i$ has an approximate functional dependence of the form:

$$l_i = 1/nf(E/n)$$

whereby, in practice, the function f(E/n) can (by approximation) be expressed as a natural logarithm (ln):

$$f(E/n) \approx a \ln(bE/n).$$

Values of the coefficients a, b can, for example, be calculated and/or derived from calibration runs, and the following table gives some values, for guidance purposes:

| Gas | a ($m^{-2}$) | b ($V^{-1}m^{-2}$) | Fit domain E/n ($Vm^2$) |
|---|---|---|---|
| Ar | $2.50 \times 10^{17}$ | $5.56 \times 10^{19}$ | $2.3 \times 10^{-19} - 2.0 \times 10^{-17}$ |
| He | $6.93 \times 10^{17}$ | $5.39 \times 10^{19}$ | $3.7 \times 10^{-20} - 5.0 \times 10^{-18}$ |
| Xe | $2.22 \times 10^{17}$ | $2.32 \times 10^{19}$ | $3.1 \times 10^{-19} - 2.4 \times 10^{-17}$ |

The neutral density n can be expressed in terms of pressure p using the ideal gas approximation:

$$p = nk_B T_o$$

in which $k_B$ is the Boltzmann constant and $T_o$ is the operating temperature; there is therefore essentially a linear relationship between p and n (for given $T_o$). Adjustments to one or more of the parameters E, n, p can, if desired, be carried out manually by a skilled operator. Alternatively, a controller (microprocessor) can be configured (programmed) to make such adjustments, e.g. in dependence upon the value of d for a given (selected) CIIS module.

An immediate advantage of the insights set forth above is the realization that—contrary to common wisdom—a NAIS source can actually have much larger dimensioning than traditionally has been the case (thereby simplifying its manufacture considerably) and yet concurrently achieve desired operating parameters (such as high brightness/low energy spread); key to this realization is the co-adjustment of other parameters (such as the operating pressure, for example) to ensure that, despite an enlargement of d, the value of $Q_S$ remains within an acceptable range. This allows innovative NAIS devices with d>1000 nm, for example.

It should be realized that, just because the inventive source assembly comprises a plurality of CIIS modules with a variety of different d-values, this does not mean that all CIIS modules present on the carrier have to have different d-values. There may, for example, be a group of CIIS modules with a given d-value, in which:
- All members of the group are identical, allowing fallback/reserve CIIS modules in case one member of the group reaches its end-of-lifetime; and/or
- Some members of the group may differ as regards other parameters, such as output aperture diameter, supply duct dimensioning, etc.

There are various ways in which a plurality of different collision ionization ion sources (CIIS) can be incorporated into a source assembly according to the present invention. For example:
(i) One can choose an integrated/monolith approach, wherein several CIIS modules are provided as integrated components on a single chip structure; this, in turn, can be mounted on a carrier (such as a rod, plate, etc.) to allow it to be conveniently placed and held in the path of the employed input beam.
(ii) One can choose a distributed/composite approach, wherein each of said plurality of CIISs is provided as an integrated device on a separate chip structure, and these separate chip structures are mounted on different positions on a carrier (such as a plate, frame, scaffold, etc.).

An advantage of approach (i) is its very small size—though this will generally entail increased manufacturing complexity.

An advantage of approach (ii) is that it is relatively easy to manufacture. It is also relatively easy to repair/refurbish, in that a given CIIS can be easily removed/replaced if necessary without having to remove/replace all the other CIISs as well.

As regards the selecting device used in the inventive source assembly, it can also be embodied in various ways. For example, it may comprise one or both of:
(a) A mechanical actuator mechanism, for moving the employed carrier relative to the input beam, so as to position a selected CIIS in a path of that beam. Such a mechanism can make translatory and/or rotary movements, e.g. with the aid of a stepper motor, piezoelectric actuator, etc. In such a situation, the coordinates of the (centers of the) various input zones on the plurality of CIIS modules can be stored in a lookup table, allowing the actuator mechanism to rapidly position a given CIIS in the input beam path when required.

(b) A beam deflector mechanism, for deflecting the input beam relative to the employed carrier, so as to direct the input beam into a selected CIIS. Such a mechanism may, for example, employ electrostatic and/or magnetic beam deflection. Analogous to the situation in (a), a lookup table can be employed to store a list of vectorial beam deflections necessary to accurately deflect the beam into the input zones of the various CIIS modules present in the source assembly.

The current invention should not be confused with the content of U.S. Pat. No. 9,224,569, (also owned by the present assignee), which only relates to the use of different ion species, and does not disclose/suggest either of:

The use of multiple CIIS sources with different dimensional characteristics, for the purpose of allowing a variety of different beam parameters (such as brightness, current, energy spread, etc.) to be selected (for a given ion species).

Considerations/insights pertaining to (advantageous value ranges of) the ionic scattering quotient Qs of a CIIS.

The invention will now be elucidated in more detail on the basis of exemplary embodiments and the accompanying schematic drawings, in which:

FIG. 1A renders a cross-sectional elevational view of an embodiment of a CIIS—in this case a NAIS—suitable for use in an ion source assembly according to the present invention.

Figure 1B:
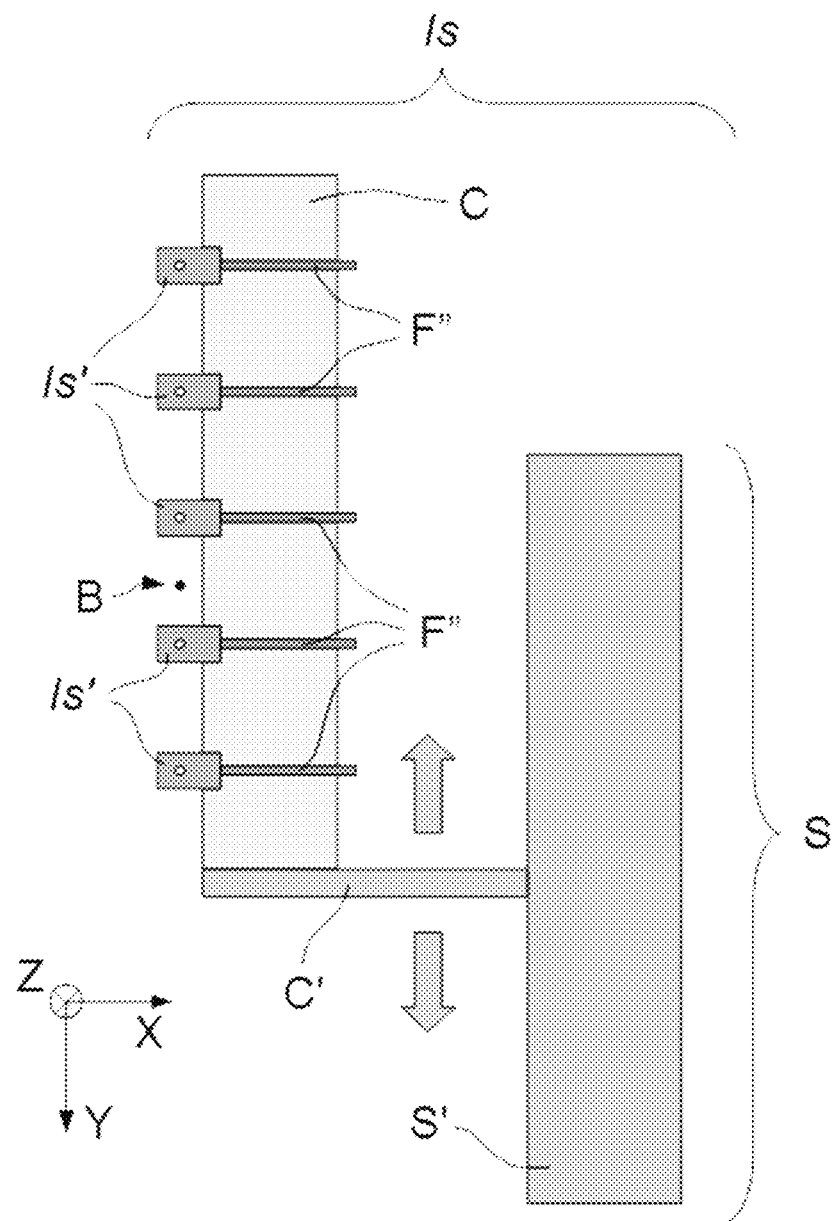

FIG. 1B illustrates an embodiment of an ion source assembly according to the present invention, employing a plurality of different CIIS similar to that illustrated in FIG. 1A.

Figure 2:
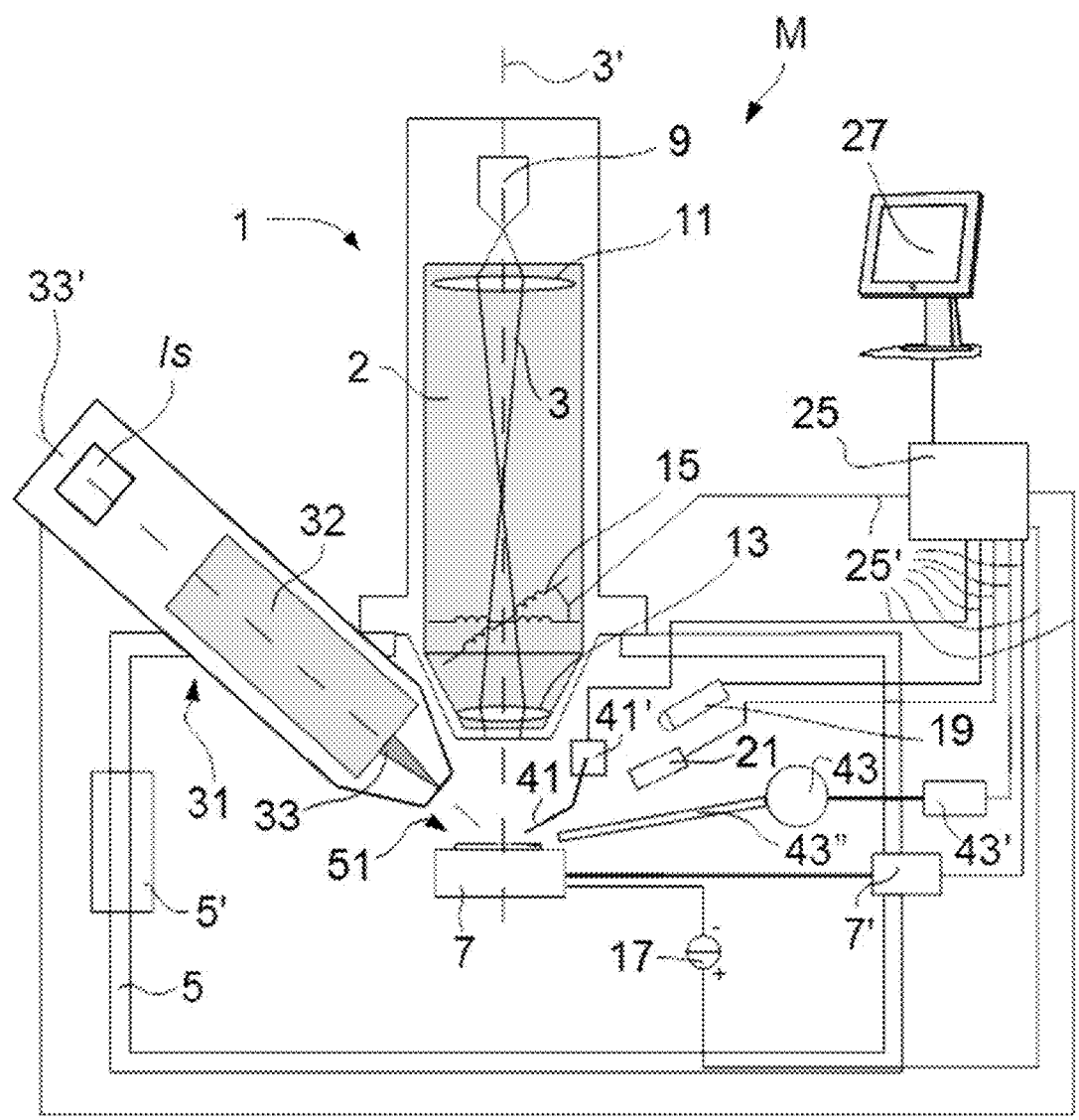

FIG. 2 renders a longitudinal cross-sectional view of an embodiment of a CPM in which the present invention is implemented In the Figures, where pertinent, corresponding parts are indicated using corresponding reference symbols. It should be noted that, in general, the Figures are not to scale.

Embodiment 1

FIG. 1A renders a cross-sectional elevational view of an embodiment of a CIIS Is' (in this case a NAIS) suitable for use in an ion source assembly Is according to the present invention (which employs a plurality of different CIIS sources Is'—see FIG. 1B). As here illustrated, the CIIS Is' comprises:

An input aperture (zone) A1, to admit a focused input beam B of charged particles, such as electrons (produced by a non-depicted electron source, such as a Schottky emitter, for instance).

An output aperture A2, located opposite said input aperture A1, to allow emission of a flux B' of ions. As here depicted, each of apertures A1 and A2 has a diameter A.

An ionization space R, in which (molecules/atoms of) gas F (such as argon gas, for example) can be ionized by said input beam B so as to produce said ions B'. This space R is substantially located between said input aperture A1 and output aperture A2, though it may protrude to some extent through one or both of apertures A1, A2, for example.

A supply duct F', for supplying a flow of said gas F to said ionization space R. As here depicted, the supply duct F' is delimited by a pair of oppositely-located retaining plates P1, P2 (which, in the case of a NAIS, are thin enough to be referred to as "membranes"). A first plate P1 in this pair contains said input aperture A1, and the second plate P2 contains said output aperture A2, with a spacing/separation d between the plates P1, P2 which also defines the height of the ionization space R. Note that a "plug" P3 seals off the supply duct F' duct on one side (the side opposite to the inward flow of gas F). The first plate P1 has a thickness d', and the second plate P2 will often have (approximately) the same thickness. To provide some general guidance, the following non-limiting values may apply to such a depicted source Is':

Plate spacing d (at ionization space R): ca. 100-2000 nm.
Plate thickness d': ca. 100-300 nm.
Aperture diameter A: ca. 100-1200 nm.
Gas pressure in ionization space R: ca. 100-1500 mbar.
Beam current in beam B: ca. 50-200 nA.

The plates P1, P2 (and plug P3) may, for example, comprise a material such as molybdenum, platinum or tungsten. A voltage supply (not depicted) can be used to apply a (DC) voltage difference between plates P2 and P1 (e.g. ca. 1 volt), so as to bias plate P1 to a more positive potential than plate P2, thereby creating an electric field directing (positively charged) ions towards plate P2 and through aperture A2. It should be noted that the supply duct F' does not have to emerge directly into the ionization space R; rather, if desired, there may be a buffer chamber in the vicinity of/surrounding the ionization space R, and the supply duct F' can feed the ionization space R via this buffer chamber.

A structure such as this can, for example, be conveniently manufactured using a chip bonding procedure, whereby the "upper half" (plate P1, etc.) and the "lower half" (plate P2, etc.) are manufactured on two separate substrates (or substrate portions)—e.g. using etching/ablation techniques—after which one half is inverted onto the other, aligned and bonded in position, using appropriate spacers (such as plug P3) to help create the interposed duct/channel F'. The apertures A1, A2 can be created using etching/ablation, either prior to or after bonding—for example, a thin actinic (e.g. focused ion) beam can be used to radiatively "drill" through the bonded halves from one side, thus realizing perfect mutual alignment of the apertures. Specific examples of chip bonding techniques in the current context include direct bonding, thermocompression bonding, eutectic bonding, anodic bonding, etc.

If desired, the "uniform-height" supply duct F' in FIG. 1A can, for example, be replaced by a "multi-height" supply duct as set forth in the aforementioned U.S. Ser. No. 15/405,139.

Turning now to FIG. 1B, this shows a plan view of an embodiment of an ion source assembly Is according to the present invention. The depicted source assembly Is comprises a carrier C—such as a metallic plate or frame, for example—provided with a plurality of different CIIS modules Is', e.g. arranged along an edge of the carrier C. Each CIIS Is' is of a type as depicted in FIG. 1A, for example, but at least some of them are mutually different in respect of their inter-plate gap height d (see FIG. 1A). Also depicted is a selecting device S, which allows a given one of said CIIS modules Is' to be individually selected for production of an output ion beam (B') from an input charged-particle beam (e.g. electron beam) B. A footprint of this input beam B (which propagates along the depicted Z axis) is schematically illustrated as a black dot, matched in size to the respective input zones (schematically illustrated as white dots) of the CIIS modules Is'. As here embodied, the selecting device S comprises a mechanical actuator mechanism S', which can be used to move the carrier C (attached to an actuation arm C') relative to the input beam B, thereby allowing a selected CIIS Is' to be aligned with a propagation axis of beam B. The depicted actuator mechanism S' can, for example, have a relatively large movement stroke in Y (e.g. of the order of tens of millimeters), but need only have a relatively small (correctional) movement stroke in X (e.g. of the order of a few hundred microns).

Also depicted are gas supply lines (tubes/pipes) F''', which serve to supply gas to the various CIIS modules Is'. These supply lines F''' can, for example, be connected to individual gas reservoirs (tanks), or to a valve assembly (switching unit) that allows a selectable one of them to be connected through to a common gas reservoir. Each supply line F''' will generally comprise a throttle valve somewhere along its course, to allow the gas supply pressure to be adjusted (thereby also adjusting the ionic mean free path $l_i$). Such throttle valves can be controlled manually, or by a pre-programmed controller device such as a microprocessor.

It should be noted that, as an alternative to the "rectilinear" (translatory) architecture depicted in FIG. 1B, one could instead opt for a circular (rotational) architecture, whereby (for example):

The component CIIS modules Is' are disposed along the perimeter of a disc-shaped carrier C;

The mechanical actuator S' is a rotary actuator, which rotates said disc-shaped carrier relative to a propagation axis of beam B located above/proximal the carrier perimeter.

It should also be noted that, instead of moving the carrier C relative to the beam B, one could alternatively/supplementally opt to move the beam B relative to the carrier C, e.g. using a deflector assembly (not depicted) to cause selectable deflections of the beam B from its nominal course parallel to Z.

Embodiment 2

FIG. 2 is a highly schematic depiction of an embodiment of a charged-particle focusing apparatus—in this case a Charged Particle Microscope M—in which the present invention is implemented; more specifically, it shows an embodiment of a FIB-SEM, though, in the context of the current invention, it could just as validly be a purely ion-based microscope, for example. The microscope M comprises a particle-optical column 1, which produces a beam 3 of charged particles (in this case, an electron beam) that propagates along a particle-optical axis 3'. The column 1 is mounted on a vacuum chamber 5, which comprises a specimen holder 7 and associated actuator(s) 7' for holding/positioning a specimen 51. The vacuum chamber 5 is evacuated using vacuum pumps (not depicted). With the aid of voltage supply 17, the specimen holder 7, or at least the specimen 51, may, if desired, be biased (floated) to an electrical potential with respect to ground. Also depicted is a vacuum port 5', which may be opened so as to introduce/remove items (components, specimens) to/from the interior of vacuum chamber 5. A microscope M may comprise a plurality of such ports 5', if desired.

The column 1 (in the present case) comprises an electron source 9 (such as a Schottky gun, for example) and an illuminator 2. This illuminator 2 comprises (inter alia) lenses 11, 13 to focus the electron beam 3 onto the specimen 51, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the specimen 51 in response to irradiation by the (impinging) beam 3. In the apparatus depicted here, the following (non-limiting) detector choices have been made:

Detector 19 is a solid state detector (such as a photodiode) that is used to detect cathodoluminescence emanating from the specimen 51. It could alternatively be an X-ray detector, such as Silicon Drift Detector (SDD) or Silicon Lithium (Si(Li)) detector, for example.

Detector 21 is an electron detector in the form of a Solid State Photomultiplier (SSPM) or evacuated Photomultiplier Tube (PMT) [e.g. Everhart-Thornley detector], for example. This can be used to detect backscattered and/or secondary electrons emanating from the specimen 51.

The skilled artisan will understand that many different types of detector can be chosen in a set-up such as that depicted, including, for example, an annular/segmented detector.

By scanning the beam 3 over the specimen 51, stimulated radiation—comprising, for example, X-rays, infrared/visible/ultraviolet light, secondary electrons (SEs) and/or backscattered electrons (BSEs)—emanates from the specimen 51. Since such stimulated radiation is position-sensitive (due to said scanning motion), the information obtained from the detectors 19, 21 will also be position-dependent. This fact allows (for instance) the signal from detector 21 to be used to produce a BSE image of (part of) the specimen 51, which image is basically a map of said signal as a function of scan-path position on the specimen 51.

The signals from the detectors 19, 21 pass along control lines (buses) 25', are processed by the controller 25, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

In addition to the electron column 1 described above, the microscope M also comprises an ion-optical column 31. This comprises an ion source assembly Is according to the present invention (e.g. such as that illustrated in FIG. 1B) and an illuminator 32, and these produce/direct an ion beam 33 along an ion-optical axis 33'. To facilitate easy access to specimen 51 on holder 7, the ion axis 33' is canted relative to the electron axis 3'. As hereabove described, such an ion (FIB) column 31 can, for example, be used to perform processing/machining operations on the specimen 51, such as incising, milling, etching, depositing, etc. Alternatively, the ion column 31 can be used to produce imagery of the specimen 51.

As here depicted, the CPM M makes use of a manipulator arm 41, which can be actuated in various degrees of freedom by actuator system 41', and can (if desired) be used to assist in transferring specimens to/from the specimen holder 7, e.g. as in the case of a so-called TEM lamella excised from the specimen 51 using ion beam 33.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 43', and can be administered through a narrow nozzle 43'', so as to emerge in the vicinity of the intersection of axes 3' and 33', for example.

It should be noted that many refinements and alternatives of such a set-up will be known to the skilled artisan, such as the use of a controlled environment at the specimen 51, e.g. maintaining a pressure of several mbar (as used in an Environmental SEM or low-pressure SEM).

The invention claimed is:

1. A source assembly for producing an ion beam comprising:
   a collision ionization ion source comprising:
   a pair of stacked plates, sandwiched about an intervening gap;
   an ionization space between said plates, connected to a gas supply duct;
   an input zone, provided in a first of said plates, to admit an input beam of charged particles to said ionization space; and
   an output aperture, located opposite said input zone and provided in the second of said plates, to allow emission of a flux of ions produced in said ionization space by said input beam,
   a carrier provided with a plurality of different collision ionization ion sources that mutually differ in respect of a gap height d between said plates; and
   a selecting device, which allows a given one of said ion sources to be individually selected for production of said ion beam.

2. A source assembly according to claim 1, wherein said plurality of collision ionization sources are provided as integrated devices on a single chip structure mounted on said carrier.

3. A source assembly according to claim 1, wherein each of said plurality of collision ionization sources is provided as an integrated device on a separate chip structure, and these separate chip structures are mounted on different positions on said carrier.

4. A source assembly according to claim 1, wherein said selecting device consists of at least one of:
   a mechanical actuator mechanism, for moving said carrier relative to said input beam, so as to position a selected collision ionization ion source in a path of that beam; and
   a beam deflector mechanism, for deflecting said input beam relative to said carrier, so as to direct that beam into a selected collision ionization ion source.

5. A source assembly according to claim 1, wherein at least some of the collision ionization ion sources on said carrier differ as regards their output aperture diameter.

6. A source assembly according to claim 1, wherein a given pair of collision ionization ion sources in said source structure are configured to be mutually different in respect of at least one of:
   ion beam brightness;
   ion beam energy spread;
   ion beam emission current;
   ion beam opening angle; and
   ion beam virtual source size.

7. A source assembly according to claim 1, further comprising a controller that is configured to adjust at least one of the following parameters:
   a gas pressure in said ionization space; and
   an electrical potential applied between said plates,
so that an ionic scattering quotient $Q_S=d/l_i$ maintains a value in a range of 1-500, where $l_i$ is an ionic mean free path length in said ionization space.

8. A source assembly according to claim 7, wherein $Q_S$ lies in the range of from 5 to 15.

9. A method of producing an ion beam using a collision ionization ion source comprising:
   a pair of stacked plates, sandwiched about an intervening gap;
   an ionization space between said plates, connected to a gas supply duct;
   an input zone, provided in a first of said plates, to admit an input beam of charged particles to said ionization space; and
   an output aperture, located opposite said input zone and provided in the second of said plates, to allow emission of a flux of ions produced in said ionization space by said input beam,
   the method comprising:
   providing a source assembly comprising a carrier provided with a plurality of different collision ionization ion sources that mutually differ in respect of a gap height d between said plates;
   using a selecting device to select a given one of said ion sources for production of said ion beam; and
   adjusting at least one of the following parameters:
      a gas pressure in said ionization space; and
      an electrical potential applied between said plates,
   so that an ionic scattering quotient $Q_S=d/l_i$ maintains a value in a range of from 1 to 500, where $l_i$ is an ionic mean free path length in said ionization space.

10. A method according to claim 9, comprising the following steps:
   using said selecting device to select a first collision ionization ion source from said plurality, so as to produce a first ion beam for a first purpose; and thereafter:
   using said selecting device to select a second, different collision ionization ion source from said plurality, so as to produce a second, different ion beam for a second, different purpose.

11. An ion focusing apparatus comprising:
   a source assembly, for producing an ion beam;
   a specimen holder, for holding a specimen in an irradiation position; and
   an optical column, for directing said beam so as to irradiate said specimen, which source assembly is as claimed in claim 1.

12. An ion focusing apparatus according to claim 11, which apparatus is selected from the group consisting of:
   a charged particle microscope; and
   a lithography imager.

13. A source assembly according to claim 2, wherein said selecting device comprises consists of at least one of:
   a mechanical actuator mechanism, for moving said carrier relative to said input beam, so as to position a selected collision ionization ion source in a path of that beam; and
   a beam deflector mechanism, for deflecting said input beam relative to said carrier, so as to direct that beam into a selected collision ionization ion source.

14. A source assembly according to claim 2, wherein at least some of the collision ionization ion sources on said carrier differ as regards their output aperture diameter.

15. A source assembly according to claim 2, wherein a given pair of collision ionization ion sources in said source structure are configured to be mutually different in respect of at least one of:

ion beam brightness;
ion beam energy spread;
ion beam emission current;
ion beam opening angle; and
ion beam virtual source size.

16. A source assembly according to claim 1, further comprising a controller that is configured to adjust at least one of the following parameters:
   a gas pressure in said ionization space; and
   an electrical potential applied between said plates,
   so that an ionic scattering quotient $O_s = d/l_i$ maintains a value in a range of 1-200, where $l_i$ is an ionic mean free path length in said ionization space.

17. An ion focusing apparatus comprising:
   a source assembly, for producing an ion beam;
   a specimen holder, for holding a specimen in an irradiation position; and
   an optical column, for directing said beam so as to irradiate said specimen, which source assembly is as claimed in claim 2.

18. The method of claim 9, wherein the value of the ionic scattering quotient $Qs = d/l_i$ is in a range of from 1 to 200.

\* \* \* \* \*